United States Patent
Ben-Efraim et al.

[11] Patent Number: 5,995,563
[45] Date of Patent: Nov. 30, 1999

[54] SYSTEM AND METHOD FOR FAST CHANNEL SWITCHING IN A SATELLITE RECEIVER

[75] Inventors: Nadav Ben-Efraim, Cupertino; Christopher R Keate, Santa Clara, both of Calif.

[73] Assignee: LSI Logic Corporation, Milpitas, Calif.

[21] Appl. No.: 08/796,467

[22] Filed: Feb. 10, 1997

[51] Int. Cl.[6] .................................................. H04L 27/22
[52] U.S. Cl. ........................ 375/344; 375/329; 375/345; 329/304
[58] Field of Search .................................... 375/329, 344, 375/350, 355, 373, 326, 345; 329/302, 308, 304

[56] References Cited

U.S. PATENT DOCUMENTS

| | | | |
|---|---|---|---|
| 4,348,641 | 9/1982 | Scott et al. | 329/302 |
| 5,255,290 | 10/1993 | Anvari | 375/344 |
| 5,418,815 | 5/1995 | Ishikawa et al. | 375/216 |
| 5,440,268 | 8/1995 | Taga et al. | 329/308 |
| 5,579,345 | 11/1996 | Kroeger et al. | 375/344 |

*Primary Examiner*—Young T. Tse
*Assistant Examiner*—Shuwang Liu
*Attorney, Agent, or Firm*—Conley, Rose & Tayon, PC; B. Noel Kivlin

[57] ABSTRACT

A DBS receiver front end which converts the received signal directly to the baseband representation and maintains a high performance with a new techniques for tracking and counteracting frequency drift and I/Q angular error. The DBS receiver front end comprises a tuner and a demodulator/decoder. The tuner receives a high frequency signal and converts it to a baseband signal having a frequency offset error. In one embodiment, the DBS receiver front end includes a demodulator/decoder which preserves frequency offset error tracking through a channel change. The demodulator/decoder receives the baseband signal and produces a compensation signal for canceling the frequency offset error. This is done using an element which generates a value indicative of the frequency offset error. Since the frequency offset error is independent of the selected channel, freezing the value indicative of the frequency offset error during a channel change enables a much faster acquisition of timing. In this manner faster channel acquisition is obtained.

3 Claims, 6 Drawing Sheets

SYSTEM AND METHOD FOR FAST CHANNEL SWITCHING IN A SATELLITE RECEIVER

BACKGROUND OF THE INVENTION

1. Field of the Invention

This invention relates to an apparatus for receiving and decoding a signal such as that transmitted according to the digital video broadcast standard ("Specifications of the Baseline Modulation/Channel Coding System for Digital Multi-Programme Television by Satellite", European Broadcasting Union, January 1994). Such signals are commonly used in satellite communications systems which employ error correction to combat signal corruption. More specifically, this invention concerns a device with a variable rate QPSK/BPSK demodulator and a concatenated Viterbi/Reed-Solomon decoder.

2. Description of the Related Art

Digital broadcast satellite (DBS) communication systems provide reliable long range transmission of information without the need for a pre-existing network of transmission lines and routing switches. However, since the costs entailed in creating a satellite and placing it in orbit are literally astronomical, the economic practicality of these systems depends in large part on widespread use of DBS receiver systems. Consequently containment of the costs while maximizing the performance of DBS receiver systems plays an important role for the emerging DBS technology.

FIG. 1 shows a diagram of portions of a DBS system 100 in operation. A service provider 102 broadcasts a signal by way of a satellite 104 to a user dish 106. In this manner, user dish 106 receives an encoded digital data stream modulated onto a carrier in the Ku-Band (12 GHz). User dish 106 has a down-converter (known as an LNB) which provides a receive signal 108 to DBS receiver 110. Receive signal 108 is obtained by shifting the frequency of the modulated signal carrier from Ku-Band to the L-Band (1-2 GHz). DBS receiver 110 comprises a front end that demodulates and decodes the digital data stream, and a back end that processes the digital data stream to implement the provided services, e.g. digital cable programming. DBS receiver 110 is colloquially referred to as a set-top box since it is commonly positioned on top of a television set 112 as shown.

In DBS system 100, the digital signal modulation is typically of the binary or quadrature phase shift keying type. The signal passes through the atmosphere and is subjected to various forms of interference. Hence the received signal is a corrupted version of the transmitted signal. Due to the power restrictions placed on satellite transmission channels, the probability of digital data errors due to signal corruption is substantial. To maximize a signal power to noise power ratio (SNR) of the signal, equalization is used. However, to make satellite communications reliable at high data rates, error correction codes are needed. The error correction coding scheme advocated by the standard referenced above is a concatenated coding scheme.

Another issue which must be addressed by the DBS receiver is frequency drift. For example, one source of frequency drift is that the carrier frequency of the output signal provided by an economical LNB can drift by +5 MHz with temperature.

FIG. 2 shows one implementation of a DBS receiver front end 200. Front end 200 comprises a tuner 202 and a demodulator/decoder 204. Tuner 202 converts received signal 108 to quadrature baseband signals. Demodulator/decoder 204 converts the quadrature baseband signals to digital form, then performs digital equalization and decoding to produce output data stream 238. As discussed further below, demodulator/decoder 204 also provides feedback signals to tuner 202 for timing and gain control.

Tuner 202 comprises a frequency synthesizer 216 (typically comprising a voltage controlled oscillator), an analog multiplier 206, an intermediate frequency bandpass filter 208, a gain control amplifier 210, an I/Q down converter 212, and a lowpass filter 214. Frequency synthesizer 216 is set by an external microprocessor 236 to be "tuned" to the received signal. The tuned frequency synthesizer provides a signal with a frequency which is offset by a fixed amount (typically 480 MHz) from the frequency of the desired received signal. The fixed amount will be the frequency of a product signal which results when multiplier 206 multiplies the signal from the frequency synthesizer and the received signal.

Multiplier 206 multiplies received signal 108 and the output signal from frequency synthesizer 216 to effectively shift the frequency of received signal 108 to an intermediate frequency (typically 480 MHz) in an intermediate frequency signal. The product signal at the output of multiplier 206 can be expressed as the sum of a desired intermediate frequency signal and other undesired by product signals. The product signal is coupled to intermediate frequency bandpass filter 208 which removes the undesired frequency components (and in so doing, removes the undesired by product signals) leaving only the intermediate frequency signal.

Output from bandpass filter 208 is coupled to gain control amplifier 210 which regulates the amplitude of the intermediate frequency signal. Gain control amplifier 210 has an adaptive gain which is set to provide a constant-maximum amplitude output signal. The regulation mechanism is a loop filter 234 which operates on a negative feedback signal provided by demodulator/decoder 204. The effect of loop filter 234 is to increase the gain of gain control amplifier 210 when the maximum amplitude of the output signal declines below a target level, and to decrease the gain when the maximum amplitude exceeds a target level.

Output of the gain control amplifier 210 is coupled to I/Q down converter 212 which converts the intermediate frequency signal to quadrature baseband signals. The conversion may take place in a similar fashion to the previous frequency conversion using output from a fixed-frequency oscillator 218, but at baseband two signals are needed. The two baseband signals represent the in-phase (I) and quadrature-phase (Q) components of the intermediate frequency signal. A lowpass filter 214 is employed in the similar fashion to the way baseband filter was used to remove undesired frequency components. In this fashion, tuner 202 converts received signal 108 to quadrature baseband signals.

Demodulator/decoder 204 comprises an analog-to-digital converter (ADC) 220, a decimation block 222, a matched filter 224, a decode logic 226, and a timing, carrier and gain error block 230. ADC 220 converts the quadrature baseband signals into digital form at a sampling rate and sampling phase determined by a signal from a voltage controlled oscillator (VCO) 228. The digital baseband signals are decimated by decimation block 222 (i.e. the sample rate is reduced by dropping a fixed number of samples from each timing interval) to a rate of two samples per symbol interval. Decimation block 224 allows for over-sampling by ADC 220. Over-sampling is the practice of sampling an analog signal at a higher rate than the symbol rate. Use of this practice allows the transfer of some filtering operations from the analog domain to the digital domain. In general, only simple analog filters are practical. For complex filtering operations, digital filters are significantly easier to implement and adjust. By over-sampling and performing the matched filter operation in the digital domain, a substantial implementation complexity reduction is achieved. Furthermore, the use of over-sampling allows relaxed tolerances on the analog filters used in the analog-to-digital conversion process, without significant impairment to the signal-to-noise ratio.

The output of decimation block 222 passes through matched filter 224, which substantially maximizes the signal-to-noise ratio of the digital baseband signals. To accomplish this, the impulse response of matched filter 224 is designed to be the time-reverse of the shape of a signal corresponding to one symbol. Hence, the impulse response is "matched" to the symbol signal. One common symbol signal shape is a square root raised cosine.

The signal provided at the output of matched filter 224 is processed by decode logic 226 to provide error correction and substantially recover the transmitted data stream. This received data stream is then provided as output signal 238. In this manner, demodulator/decoder 204 converts the quadrature baseband signals to digital form, then performs digital equalization and decoding to produce output data stream 238.

The signal provided at the output of matched filter 224 is processed by timing, carrier and gain error block 230 to determine an estimate of error conditions present in the signal. One estimate is for the gain error, and this estimate is passed to loop filter 234, which was described above. A second estimate is for the sampling phase error, and this estimate is passed to loop filter 232. Loop filter 232 operates to regulate the sampling phase and frequency of ADC 220. A third estimate is formed for the carrier frequency offset error. This estimate is periodically sampled by external microprocessor 236 and used to adjust the setting of frequency synthesizer 216. In this manner, demodulator/decoder 204 provides feedback signals to tuner 202 for timing and gain control.

FIG. 3 shows a second implementation of a DBS receiver front end 300. Components which have direct counterparts in front end 200 are numbered identically. Fixed-frequency oscillator 218 has been replaced with an intermediate frequency (IF) VCO 318. IF VCO 318 provides a signal to I/Q down converter 212 which a variable frequency which is regulated by loop filter 319 operating on a feedback signal provided by timing and gain error block 330. This approach allows for continuous monitoring and compensation of a limited amount of frequency drift. Large drifts must still be compensated by intervention of microprocessor 236. This is true because of the effect bandpass filter 208 has on signals which drift out of the range of the pass band.

The two discussed implementations of a DBS receiver front end are previously implemented methods for converting a DBS signal into a received data stream. Improved implementations are desirable. In particular, an implementation which does not require external microprocessor intervention for tracking frequency drift would both reduce cost and improve performance. Also, an implementation of the tuner which converts directly from the received signal to the baseband representation would be more cost effective. To make it feasible to do a direct conversion for DBS, however, a new method for correcting I/Q angular error is needed, and a new method for tracking frequency drift is needed. Further, any technique which improves the system performance with little or no added cost is desirable.

SUMMARY OF THE INVENTION

The problems outlined above are in large part solved by a DBS receiver front end which converts the received signal directly to the baseband representation and maintains a high performance with a new techniques for tracking and counteracting frequency drift and I/Q angular error. The DBS receiver front end comprises a tuner and a demodulator/decoder. The tuner receives a high frequency signal and converts it to a baseband signal having a frequency offset error. In one embodiment, the DBS receiver front end includes a demodulator/decoder which performs tuning frequency adjustments on the tuner to reduce frequency offset error without the mediation of an external microprocessor. The tuner includes a tuning-frequency synthesizer which is set to tune in a desired reception band. The setting is provided by the demodulator/decoder which mediates for an external microprocessor. In this architecture the demodulator/decoder is able to freely adjust the tuning frequency to compensate for frequency offset error. By removing the external microprocessor from the feedback loop, frequency offset error is more quickly and accurately compensated.

In another embodiment, the DBS receiver front end includes a demodulator/decoder which receives the baseband signal and produces a compensation signal for canceling the frequency offset error. The demodulator/decoder performs the frequency-offset error compensation digitally. The demodulator/decoder includes an A/D converter which over-samples (samples at a rate of more than two samples per symbol period) the baseband signal and converts it to digital form. The demodulator/decoder also includes a complex multiplier which multiplies the over-sampled digital baseband signal by the compensation signal to produce an offset-error-canceled signal. The complex multiplier is followed by a decimation block which reduces the sample rate of the offset-error-canceled signal to two samples per symbol period. This embodiment has an increased frequency offset tracking range, which allows for the use of relaxed tolerances in the tuner and LNB.

In yet another embodiment, the DBS receiver front end includes a demodulator/decoder which digitally performs I/Q angular error correction and amplitude imbalance correction. The tuner converts the high frequency signal to a baseband signal having an in-phase and a quadrature-phase component. Ideally, the components are separated by ninety degrees, but typically an angular error exists. The demodulator/decoder includes an adaptive equalizer for correcting the angular error. Having the equalizer allows for relaxed tolerances in the tuner and LNB.

In still another embodiment, the DBS receiver front end includes a demodulator/decoder which preserves frequency offset error tracking through a channel change. The demodulator/decoder receives the baseband signal and produces a compensation signal for canceling the frequency offset error. This is done using an element which generates a value indicative of the frequency offset error. Since the frequency offset error is independent of the selected channel, freezing the value indicative of the frequency offset error during a channel change enables a much faster acquisition of timing. In this manner faster channel acquisition is obtained.

BRIEF DESCRIPTION OF THE DRAWINGS

Other objects and advantages of the invention will become apparent upon reading the following detailed description and upon reference to the accompanying drawings in which.

Figure 1:
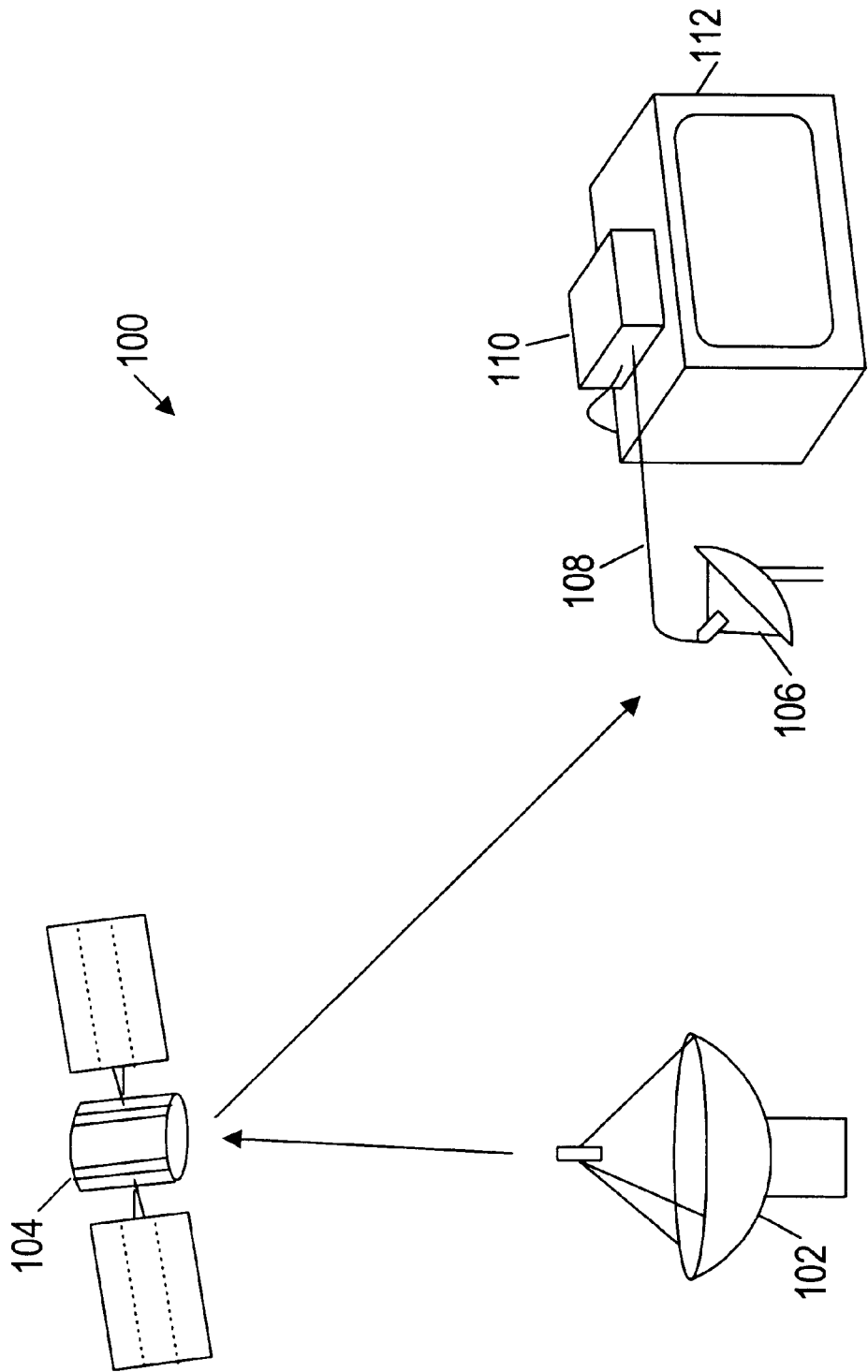
FIG. 1 is a high level view of a DBS system having a DBS receiver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
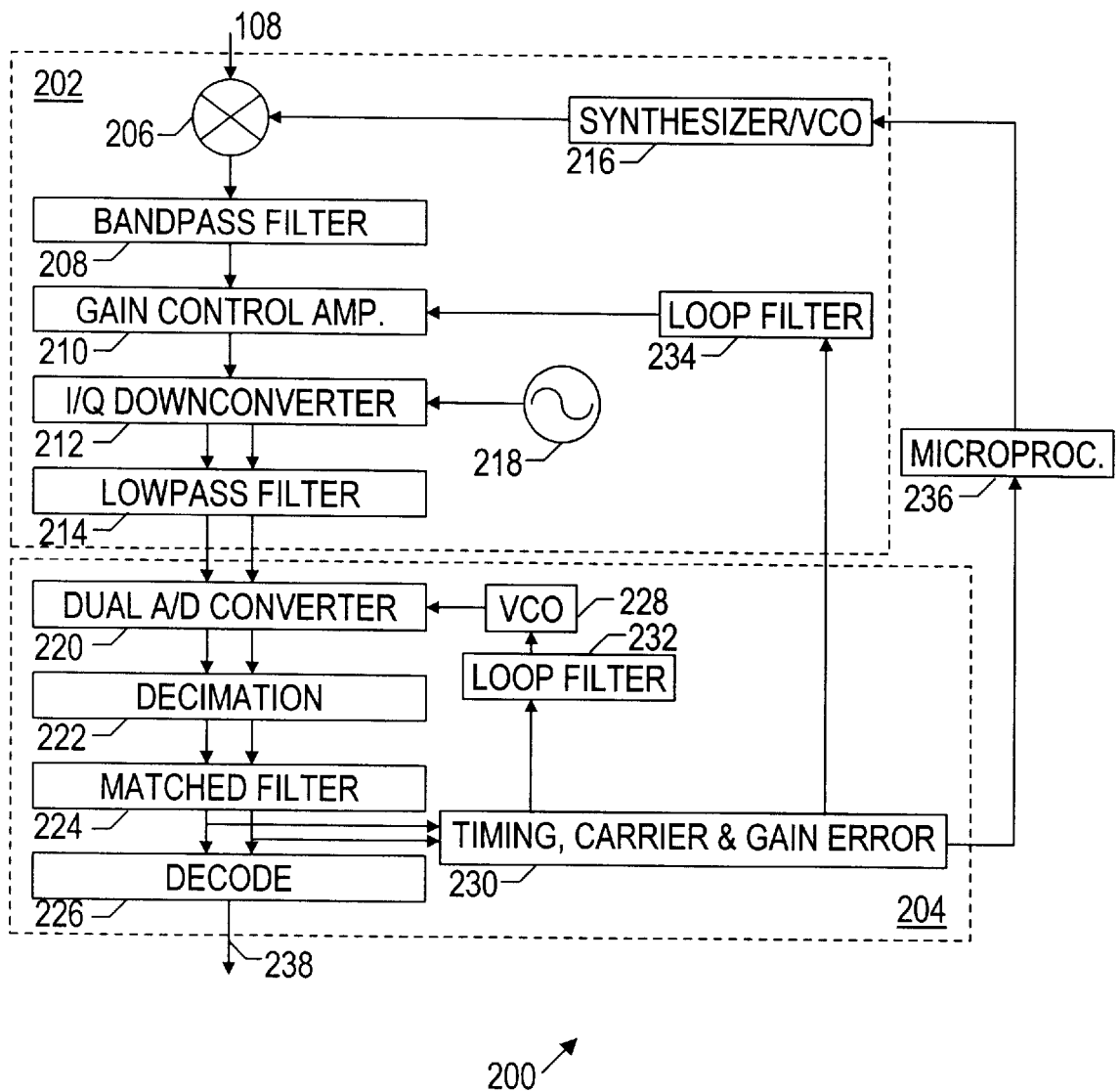
FIG. 2 is a block diagram of a DBS receiver front end embodiment which compensates for frequency offset error using an external microprocessor.
Figure 4:
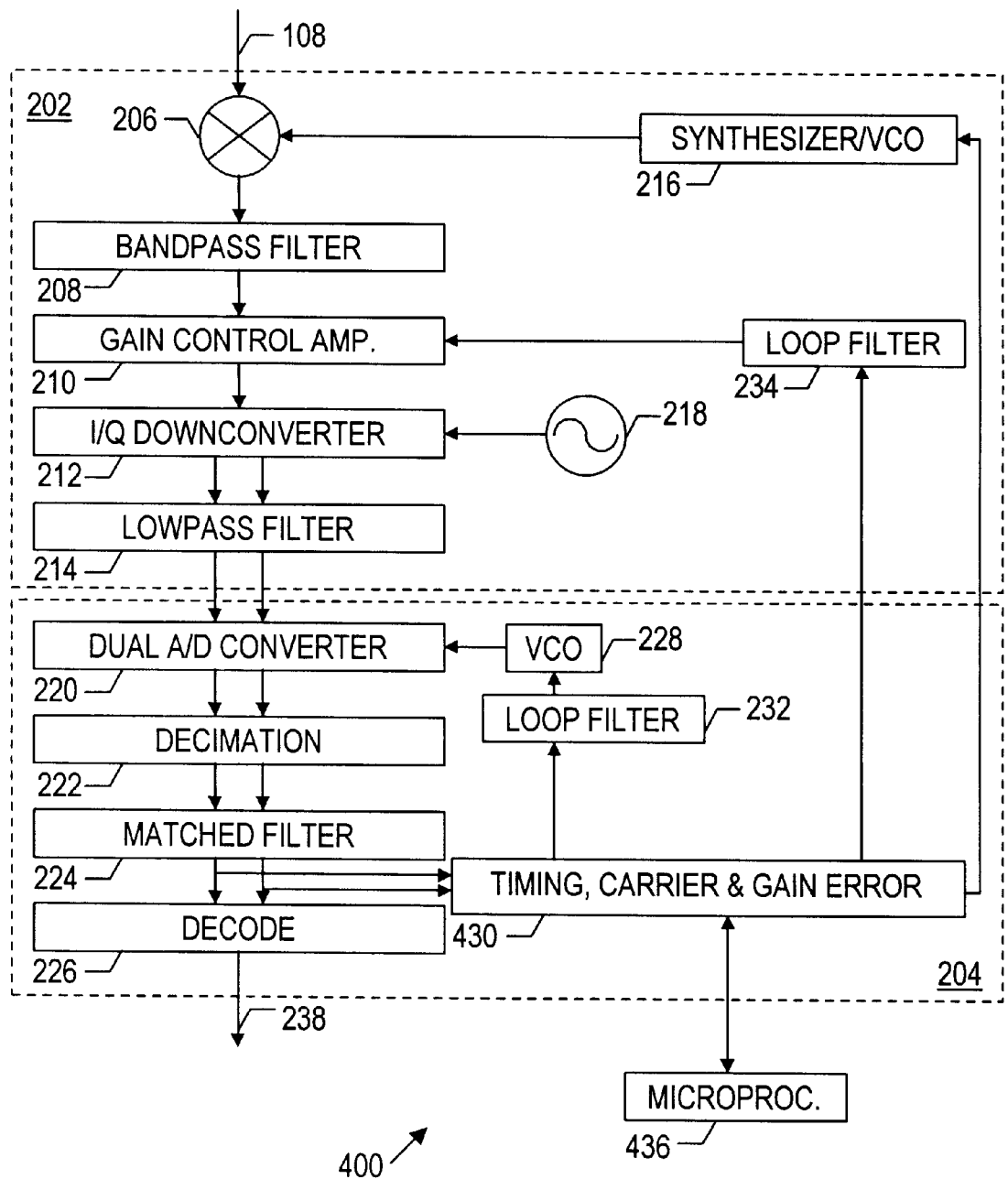
FIG. 4 is a block diagram of a DBS receiver front end embodiment which compensates for frequency offset error without the mediation of an external microprocessor.

Turning now to the drawings, FIG. 4 shows a block diagram of a DBS receiver front end 400. Comparing FIG. 2 and FIG. 4, it is noted that unlike DBS receiver front end 200, where external microprocessor 236 is coupled to frequency synthesizer 216 for selecting a reception band, DBS receiver front end 400 provides the setting to frequency synthesizer 216 from demodulator/decoder 204. Some additional logic is added to demodulator/decoder 204 to permit an external microprocessor 436 to select a desired reception band, but some advantages accrue to altering the role of the microprocessor. Receive signal 108 is subject to frequency drift which induces a frequency offset error in the output of tuner 202. For optimum performance, the frequency offset error must be a counteracted quickly and correctly. In DBS receiver front end 200, compensation of the frequency offset error can only be provided by external microprocessor 236. To determine the correct adjustment to the setting of frequency synthesizer 216, external microprocessor 236 must regularly interrupt itself and poll demodulator/decoder 204 for an estimate of the frequency offset error. It is noted that this introduces a delay in the feedback error correction of the frequency offset.

In DBS receiver front end 400, a timing, carrier and gain error block 430 is coupled to frequency synthesizer 216 without the mediation of an external microprocessor. Timing, carrier and gain error block 430 is configured to accept a reception band setting from external microprocessor 436, and thereafter the setting and adjustments are under the sole control of demodulator/decoder 204. Timing, carrier and gain error control block 430 makes direct adjustments to the setting of frequency synthesizer 216. A frequency offset error feedback loop is thereby provided without the delay introduced by conventional DBS receiver front end implementations.

Figure 3:
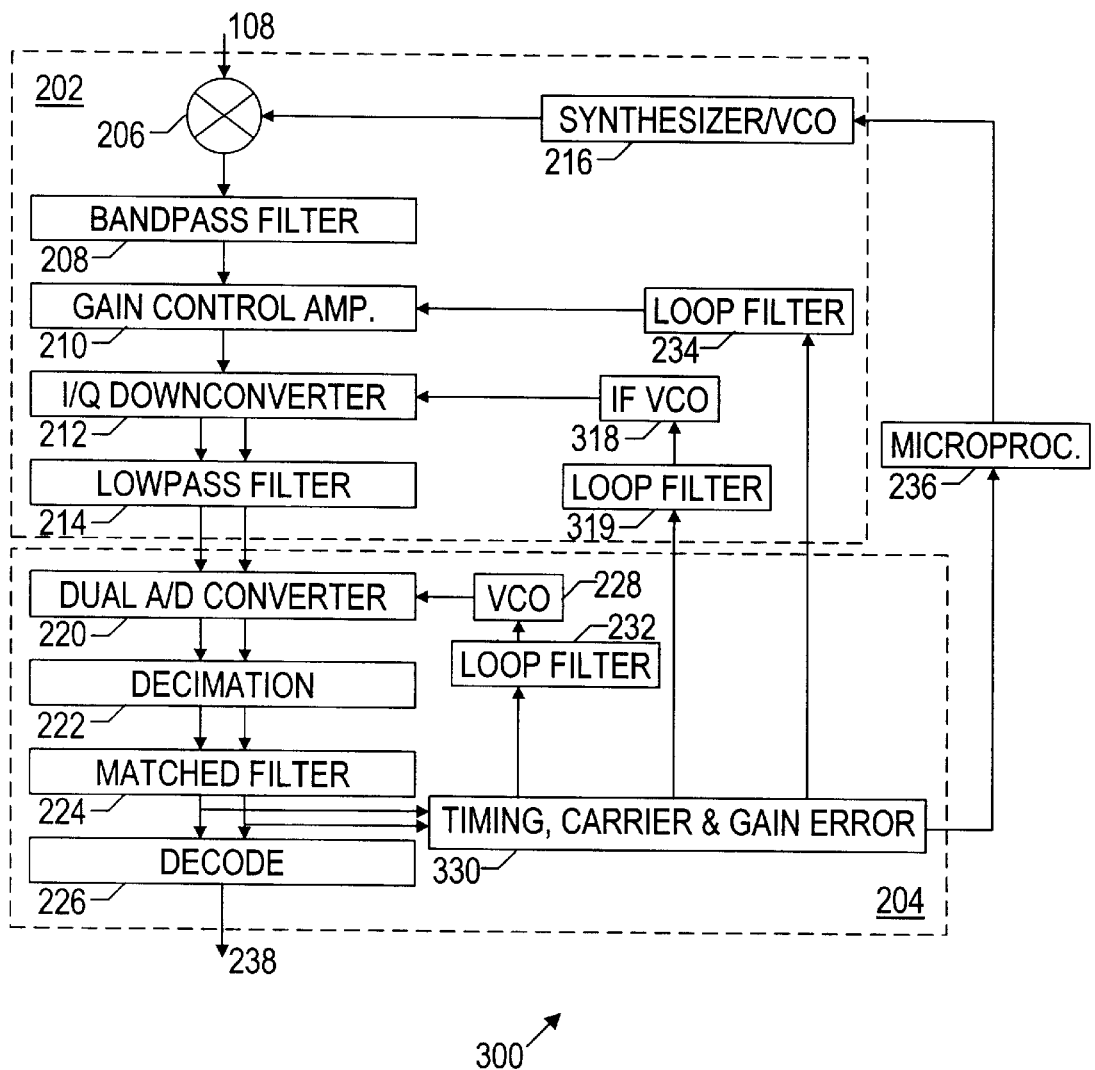
FIG. 3 is a block diagram of a DBS receiver front end embodiment which can compensate for frequency offset error by adjusting the input frequency of the I/Q downconverter.

In FIG. 3, DBS receiver front end 300 exhibits a second approach to frequency offset error correction. In front ends having an intermediate frequency (IF) stage, a limited amount of frequency offset error may be compensated for by altering the setting of the IF VCO 318 used in the downconversion from IF. Timing, carrier and gain error block 330 provides a feedback signal which is used by loop filter 319 to adjust the setting of IF VCO 318. The amount of frequency offset error which can be corrected in this fashion is limited by the necessary presence of bandpass filter 208. Once the frequency offset error has become large enough for some of the frequencies in the reception band to be removed by the bandpass filter, the distortion can no longer be corrected by adjusting IF VCO 318. Hence, in addition to this feedback path, the previous feedback method provided by the mediation of an external microprocessor is still required.

Figure 5:
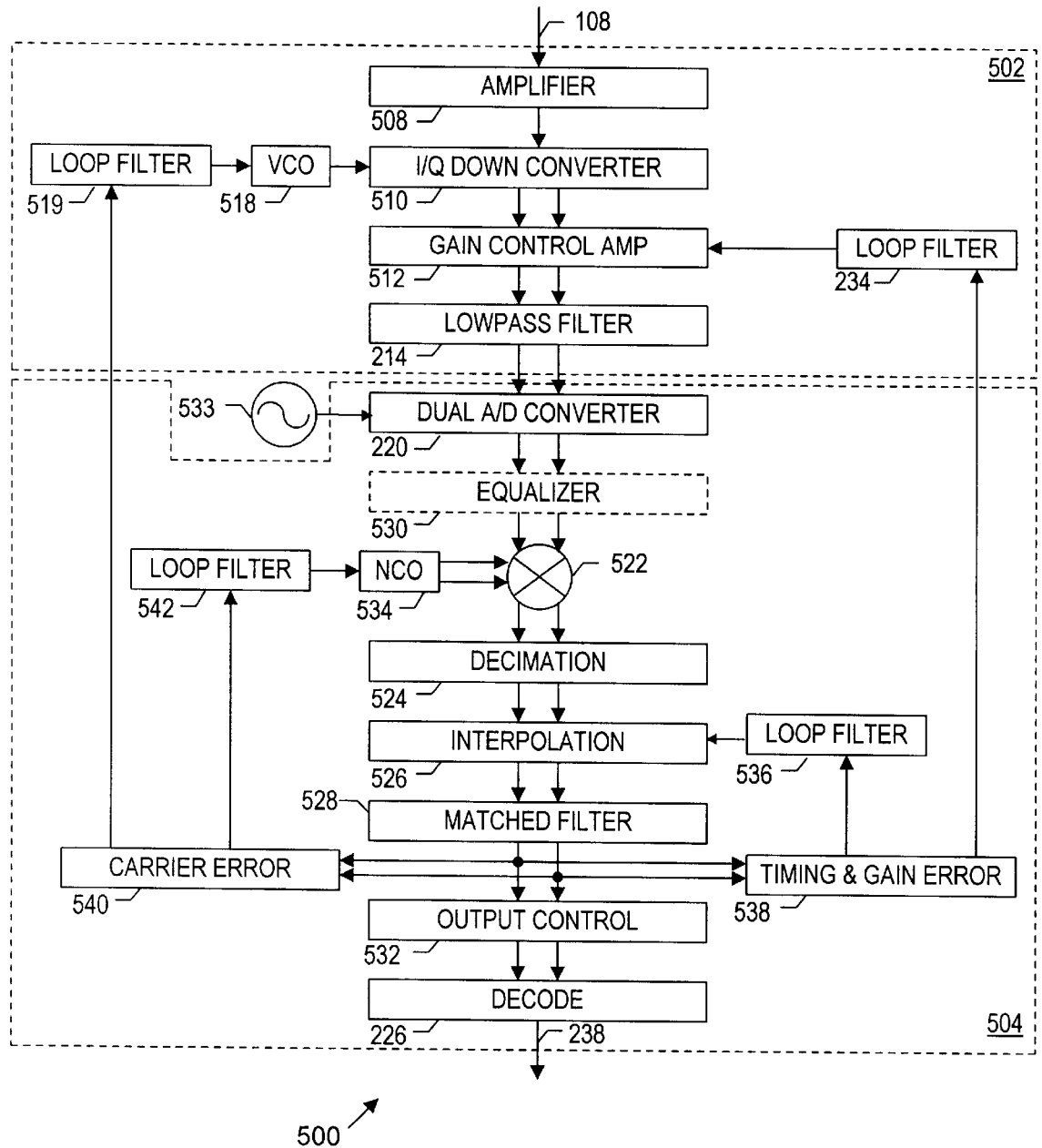
FIG. 5 is a block diagram of a DBS receiver front end embodiment which performs a direct downconversion to baseband, digitally performs frequency offset error compensation, and performs angular error correction.

Turning now to FIG. 5, a DBS receiver front end 500 is shown. Front end 500 comprises a tuner 502 and a demodulator/decoder 504. Comparing FIG. 2 and FIG. 5, it is noted that unlike tuner 202, tuner 502 performs a direct downconversion of receive signal 108 to baseband, i.e. no IF stage is present. An optional amplifier 508 buffers and amplifies receive signal 108, which is then directly converted into quadrature baseband components by I/Q downconverter 510. A frequency synthesizer 518 is set to be "tuned" to the received signal. I/Q downconverter 510 multiplies the output signal from frequency synthesizer 518 with received signal 108 to effectively shift the modulation frequency of received signal 108 to substantially zero in a baseband signal. A gain control amplifier 512 has an adaptive gain which is used to adjust the magnitude of the baseband signal to provide a constant-maximum amplitude output signal. The product signal at the output of IQ downconverter 510 can be expressed as the sum of the desired baseband signal and other undesired byproduct signals. The product signal is coupled to lowpass filter 214 which removes the undesired frequency components (and in so doing, removes the undesired byproduct signals) leaving only the baseband signal. The baseband signal is divided into two components, one signal represents the in-phase (I) component, and one represents the quadrature-phase (Q) component of receive signal 108.

Frequency synthesizer 518 is set by means of a loop filter 519, which operates on a signal provided by demodulator/decoder 504. The filter is initially set to the "correct" value for the desired reception band, then may be periodically adjusted by demodulator/decoder 504 to track the actual frequency band of the desired receive signal to compensate for frequency drift. The regulation mechanism for gain control amplifier 512 is a loop filter 234 which operates on a negative feedback signal provided by demodulator/decoder 504. The effect of loop filter 234 is to increase the gain of gain control amplifier 512 when the maximum amplitude of the output signal declines below a target level, and to decrease the gain when the maximum amplitude exceeds a target level.

Demodulator/decoder 504 comprises an analog-to-digital converter (ADC) 220, a complex multiplier 522, an optional angular error equalizer 530, a decimation block 524, an interpolation block 526, a matched filter 528, an output control circuit 532, decode logic 226, a timing and gain error block 538, and a carrier frequency error block 540. ADC 220 converts the quadrature baseband signals into digital form at a sampling rate and sampling phase determined by a signal from an external oscillator 533. As will be discussed further below, external oscillator is set to oversample (i.e. sample at a rate more than twice the highest frequency component) the baseband signals.

The digital baseband signals may then pass through an optional equalizer 530. Optional equalizer 530 is designed to correct I/Q angular error and I/Q amplitude imbalance. Ideally, the I and Q components represent portions of the receive signal that are 90 degrees out of phase. When the tuner and subsequent circuitry is less than ideal, the I and Q components may no longer be 90 degrees out of phase, and hence have an angular error sufficient to degrade performance. Additionally, the two separate signal paths for the I/Q components may result in an amplitude imbalance which can degrade performance. This angular error and amplitude imbalance is correctable by use of an adaptive finite-impulse response (FIR) filter which adjusts the amplitude and phase of one component relative to the other. Hence the addition of an angular error equalizer avoids the problem of degraded performance which might otherwise occur due to use of a direct downconversion tuner.

The digital baseband signals are then multiplied by the output signal from a numerically controlled oscillator (NCO) 534 by complex multiplier 522. NCO 534 is set to provide a signal which cancels the frequency offset error. An important advantage is gained by canceling the offset error while the signal is oversampled. The range over which the frequency offset error can be tracked and compensated is $N \cdot f_x/2$, where N is the number of samples per symbol and $f_x$ is the symbol rate. By allowing N to range as high as 16 or more, the tracking range is greatly extended relative to Nyquist sampling (N=1). Since a tuner which performs direct downconversion to baseband (e.g. tuner 502) is susceptible to significant frequency offset errors in the baseband signal, having an extended tracking range in the demodulator/decoder makes using the more cost-effective, direct downconversion tuners feasible.

The offset-error canceled signal at the output of complex multiplier 522 passes through decimation block 524 which lowpass filters the digital baseband signal in preparation for downsampling. Interpolator 526 then reduces the sampling rate to two samples per symbol, with the sampling times adjusted according to feedback from loop filter 536. The downsampled signal is coupled to matched filter 528, which is designed to substantially maximize the signal-to-noise ratio of the digital baseband signal. To accomplish this, the impulse response of matched filter 528 is designed to be the time-reverse of the shape of a signal corresponding to one symbol. Hence, the impulse response is "matched" to the symbol signal. One common symbol signal shape is a square root raised cosine.

Prior to the decoding stage, the sampling rate of the signal must be made equal to the symbol rate. This is accomplished by output control block 532 which passes on only one sample per symbol. The resulting sample sequence is processed by decode logic 226 to provide error correction and substantially recover the transmitted data stream. This received data stream is then provided as output signal 238.

The signal provided at the output of matched filter 528 is processed by timing and gain error block 538 to determine an estimate of error conditions present in the equalized signal. One estimate is for the gain error, and this estimate is passed to loop filter 234, which was described above. A second estimate is for the sampling phase error, and this estimate is passed to loop filter 536. Loop filter 536 operates to regulate the sampling phase of interpolator 526.

Based on the signal provided to the output control block 532, another estimate is formed for the frequency offset error by carrier frequency error block 540. Two frequency offset correction modes may be used. At high symbol rates (i.e. when the desired reception bandwidth is roughly the same size as the lowpass filter bandwidth), the frequency offset is corrected by causing loop filter 519 to "bump" the setting of frequency synthesizer 518. At these symbol rates, the timing loops remain locked, and performance is not compromised. At low symbol rates (i.e. when the desired reception bandwidth is significantly smaller than the lowpass filter bandwidth), the receive signal is allowed to drift within the lowpass filter, and the frequency offset error estimates are processed by loop filter 542 to adjust the setting of NCO 534.

Figure 6:
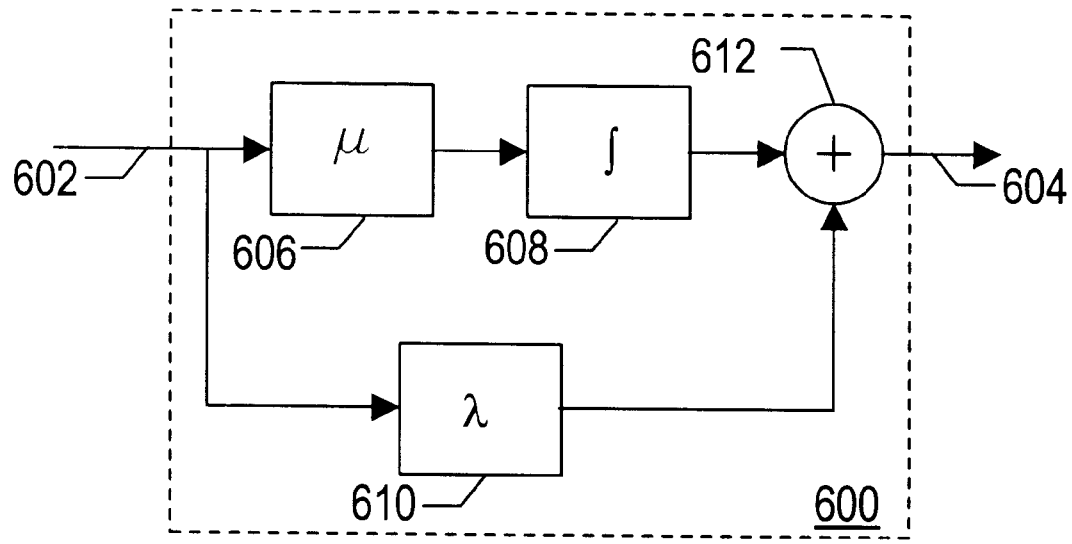
FIG. 6 is a block diagram of a loop filter which may be used timing errors to an estimate of a frequency or phase error.

Turning now to FIG. 6, a block diagram of a loop filter 600 is shown. Loop filter 600 converts an error signal 602 into a feedback signal 604. Error signal 602 is multiplied (606) by a scale factor g and integrated (608). Error signal 602 is also multiplied by a second scale factor $\lambda$ (610) and added (612) to the result from integrator 608 to form feedback signal 604. Details on the theory of feedback control may be found in many standard textbooks.

Figure 7:
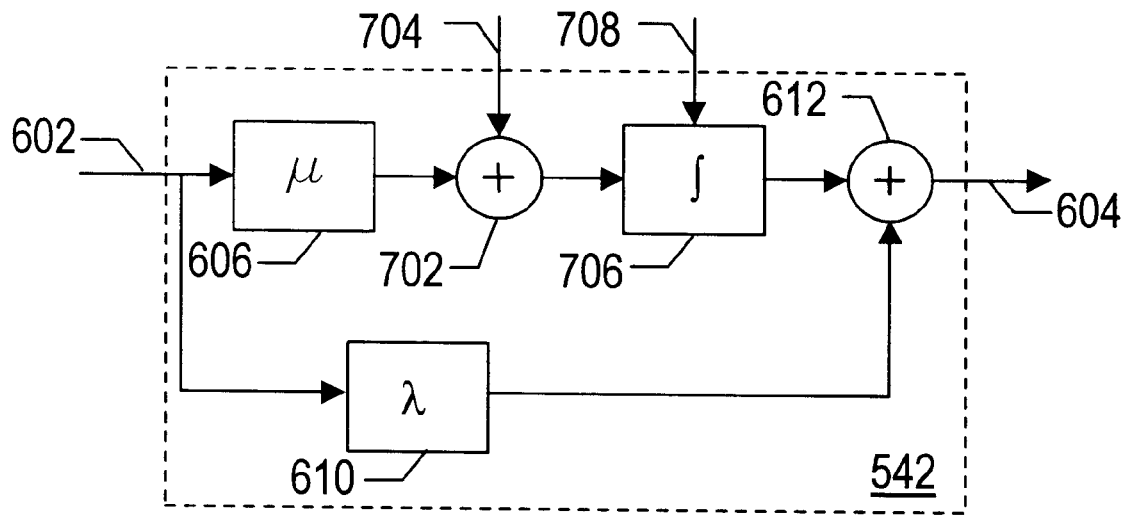
FIG. 7 is a block diagram of a loop filter with additional inputs to implement a sweep behavior and a freeze behavior.

FIG. 7 shows a block diagram of loop filter 542. Loop filter 542 operates in much the same way as loop filter 600, but with additional inputs. A sweep input 704 is added (702) to the input to the integrator 706. By setting sweep input to a constant non-zero value, feedback signal 604 is caused to "scan" across a range of settings for NCO 534. Sweep input 704 may be used during the initial signal acquisition operation of DBS receiver front end 500.

Integrator 706 operates in each clock cycle by adding the input to the contents of a register and providing the value of the register contents as the output. In ideal operation, the register contents represent the value of the frequency offset error. Since this value is not a function of the desired receive signal, it is desirable that the contents of the register not be unduly altered during a channel change. A faster return to steady state performance may be achieved by freezing the contents of the register until a phase lock has been achieved by loop filter 536. In this case, asserting input 708 would simply cause integrator 706 to stop adding the input signal to the register. In an alternate embodiment, the contents of the register may be read prior to a channel change, then written to the register after the channel change. In this case, input 708 would initialize the contents of the register to the stored value. This approach would have much the same affect, but with added flexibility of allowing an initialization to a calculated value should the feedback signal setting which corresponds to the frequency offset error be a function of the desired receive band.

In summary, DBS receiver embodiments have been described which (1) do not require external microprocessor intervention for tracking frequency drift, (2) convert directly from the received signal to the baseband representation, (3) digitally track and compensate for frequency offset error in the demodulator/decoder, (4) correct I/Q angular error using a digital equalizer, and (5) preserve the estimate of frequency offset error across a channel change. Each of these characteristics individually and in combination act to improve the DBS receiver front end performance and/or decrease implementation cost.

Numerous variations and modifications will become apparent to those skilled in the art once the above disclosure is fully appreciated. It is intended that the following claims be interpreted to embrace all such variations and modifications.

What is claimed is:

1. A method for fast channel switching in a digital broadcast satellite (DBS) receiver front end, wherein the method comprises the steps of:

selecting a first desired channel which contains a first receive signal;

setting an oscillator to a first frequency for shifting the first receive signal to baseband;

generating an estimate for a frequency offset error present in the shifted first receive signal;

selecting a second desired channel which contains a second receive signal;

setting the oscillator to a second frequency for shifting the second receive signal to baseband; and using said estimate for the frequency offset error present in the shifted first receive signal as an initial estimate for a frequency offset error present in the shifted second receive signal until phase lock is achieved on the shifted second receive signal.

2. The method of claim 1, further comprising the steps of:

converting said estimate to a frequency offset compensation signal; and applying said frequency offset compensation signal to said first and second receive signals.

3. A receiver front end which comprises:

a tuner configured to convert a high frequency signal from a selected reception band to quadrature baseband signals having a frequency offset error; and a demodulator/decoder which includes:

an analog-to-digital converter (ADC) configured to receive the quadrature baseband signals and a sampling signal from an external oscillator, wherein the ADC responsively converts the quadrature baseband signals into digital baseband;

a numerically controlled oscillator (NCO) configured to receive a frequency offset error estimate and to responsively provide compensation signals for canceling the frequency offset error;

a complex multiplier configured to multiply the digital baseband signals with the compensation signals to produce offset-error-canceled signals;

an interpolation block configured to receive the offset-error-canceled signals and a phase adjust signal, wherein the interpolation block responsively reduces the sampling rate of the offset-error-canceled signal to produce an interpolated signal;

a matched filter configured to substantially maximize a signal-to-noise ratio of the interpolated signal to produce a match-filtered signal;

decode logic configured to convert the match-filtered signal into an output data stream;

a timing error detector coupled to the matched filter to receive the match-filtered signal and configured to responsively generate a phase-error signal;

a first loop filter coupled to the timing error detector to receive the phase-error signal and configured to responsively produce said phase adjust signal;

a carrier frequency error detector coupled to the matched filter to receive the match-filtered signal and configured to responsively generate a frequency-error signal;

a second loop filter coupled to the carrier frequency error detector to receive the frequency-error signal and configured to responsively provide said frequency offset error estimate, wherein the second loop filter includes a register with contents that are indicative of the frequency offset error, wherein the second loop filter is configured to regularly update the register contents based on the frequency error signal, and wherein the second loop filter is configured to freeze the contents of the register after the selected reception band is changed and maintain the contents unaltered until the first loop filter has achieved phase lock.

* * * * *